United States Patent
Gardner et al.

(10) Patent No.: US 11,594,535 B2
(45) Date of Patent: Feb. 28, 2023

(54) HIGH PERFORMANCE NANOSHEET FABRICATION METHOD WITH ENHANCED HIGH MOBILITY CHANNEL ELEMENTS

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 3 days.

(21) Appl. No.: 17/447,506

(22) Filed: Sep. 13, 2021

(65) Prior Publication Data
US 2022/0020744 A1     Jan. 20, 2022

Related U.S. Application Data

(62) Division of application No. 16/592,580, filed on Oct. 3, 2019, now Pat. No. 11,195,832.

(51) Int. Cl.
*H01L 21/00* (2006.01)
*H01L 27/092* (2006.01)
(Continued)

(52) U.S. Cl.
CPC .... *H01L 27/092* (2013.01); *H01L 21/823807* (2013.01); *H01L 21/823814* (2013.01);
(Continued)

(58) Field of Classification Search
CPC ........... H01L 27/092; H01L 21/823807; H01L 21/823814
See application file for complete search history.

(56) References Cited

U.S. PATENT DOCUMENTS 10,008,583 B1 *  6/2018  Rodder ............... H01L 29/6656
10,332,985 B2 *  6/2019  Wong .................... H01L 29/401
(Continued)

FOREIGN PATENT DOCUMENTS

CN        114503277 A  *  5/2022   ......... H01L 21/8221
KR   10-2018-0123422 A     11/2018
(Continued)

OTHER PUBLICATIONS

International Search Report and Written Opinion dated Nov. 27, 2020 in PCT/US2020/046661, citing documents AA, AD, AG, AO therein, 11 pages.

*Primary Examiner* — Laura M Menz
(74) *Attorney, Agent, or Firm* — Oblon, McClelland, Maier & Neustadt, L.L.P.

(57) ABSTRACT

In a method for forming a semiconductor device, an epitaxial layer stack is formed over a substrate. The epitaxial layer stack includes intermediate layers, one or more first nano layers with a first bandgap value and one or more second nano layers with a second bandgap value. Trenches are formed in the epitaxial layer stack to separate the epitaxial layer stack into sub-stacks such that the one or more first nano layers are separated into first nano-channels, and the one or more second nano layers are separated into second nano-channels. The intermediate layers are recessed so that the first nano-channels and the second nano-channels in each of the sub-stacks protrude from sidewalls of the intermediate layers. Top source/drain (S/D) regions are formed in the trenches and in direct contact with the first nano-channels. Bottom source/drain (S/D) regions are formed in the trenches and in direct contact with the second nano-channels.

11 Claims, 11 Drawing Sheets

(51) Int. Cl.
  *H01L 29/786* (2006.01)
  *H01L 29/161* (2006.01)
  *H01L 29/423* (2006.01)
  *H01L 21/8238* (2006.01)
  *H01L 29/24* (2006.01)

(52) U.S. Cl.
  CPC .... *H01L 21/823828* (2013.01); *H01L 29/161* (2013.01); *H01L 29/24* (2013.01); *H01L 29/42392* (2013.01); *H01L 29/78696* (2013.01)

(56) References Cited

U.S. PATENT DOCUMENTS

| | | | | |
|---|---|---|---|---|
| 10,381,438 | B2* | 8/2019 | Zhang | H01L 29/66742 |
| 10,651,291 | B2* | 5/2020 | Frougier | H01L 29/78696 |
| 10,833,085 | B2* | 11/2020 | Shin | H01L 29/785 |
| 11,133,310 | B2* | 9/2021 | Fulford | H01L 27/0688 |
| 11,195,832 | B2* | 12/2021 | Gardner | H01L 29/78696 |
| 11,410,888 | B2* | 8/2022 | Gardner | H01L 27/0922 |
| 2013/0161756 | A1* | 6/2013 | Glass | H01L 29/775 257/E21.632 |
| 2018/0097111 | A1* | 4/2018 | Zhu | H01L 21/823807 |
| 2019/0058052 | A1* | 2/2019 | Frougier | H01L 29/0665 |
| 2019/0067456 | A1* | 2/2019 | Wong | H01L 21/324 |
| 2019/0131396 | A1* | 5/2019 | Zhang | H01L 21/02236 |
| 2019/0172755 | A1* | 6/2019 | Smith | H01L 21/3065 |
| 2019/0172828 | A1* | 6/2019 | Smith | H01L 21/823842 |
| 2019/0312132 | A1* | 10/2019 | Wong | H01L 21/268 |
| 2019/0319095 | A1* | 10/2019 | Zhang | H01L 29/1037 |
| 2020/0027950 | A1* | 1/2020 | Zhu | H01L 29/66431 |
| 2020/0098753 | A1* | 3/2020 | Dewey | H01L 29/6659 |
| 2020/0219879 | A1* | 7/2020 | Shin | H01L 27/0924 |
| 2020/0365704 | A1* | 11/2020 | Chung | H01L 29/66545 |
| 2021/0104522 | A1* | 4/2021 | Gardner | H01L 29/78696 |
| 2021/0104523 | A1* | 4/2021 | Fulford | H01L 27/092 |
| 2021/0175128 | A1* | 6/2021 | Gardner | H01L 27/0688 |
| 2021/0296184 | A1* | 9/2021 | Xie | H01L 29/0673 |
| 2021/0296316 | A1* | 9/2021 | Zhu | H01L 21/0259 |
| 2021/0320035 | A1* | 10/2021 | Xie | H01L 21/3065 |
| 2021/0351180 | A1* | 11/2021 | Fulford | H01L 29/161 |
| 2021/0366782 | A1* | 11/2021 | Xie | H01L 27/092 |
| 2022/0020744 | A1* | 1/2022 | Gardner | H01L 29/24 |
| 2022/0246726 | A1* | 8/2022 | More | H01L 29/401 |

FOREIGN PATENT DOCUMENTS

| | | | | |
|---|---|---|---|---|
| WO | WO-2021007002 | A1* | 1/2021 | ............ B82Y 10/00 |
| WO | WO-2021066947 | A1* | 4/2021 | ........ H01L 21/8221 |
| WO | WO-2021066951 | A1* | 4/2021 | ............ B82Y 10/00 |

* cited by examiner

HIGH PERFORMANCE NANOSHEET FABRICATION METHOD WITH ENHANCED HIGH MOBILITY CHANNEL ELEMENTS

CROSS REFERENCE TO RELATED APPLICATIONS

This application is a divisional of U.S. patent application Ser. No. 16/592,580 filed on Oct. 3, 2019, the contents of which are hereby incorporated by reference.

FIELD OF THE INVENTION

The disclosure is related to making 3D transistors using multiple selective nano-channels for fabrication in different device regions (e.g., NMOS, PMOS). Selection of elements with highest mobility can enable larger drive currents per area of silicon. The present disclosure provides a method of fabricating germanium (Ge) and germanium tin (GeSn) nano plane to achieve such a high performance.

BACKGROUND

During manufacture of a semiconductor device, various fabrication processes are executed such as film-forming depositions, etch mask creation, patterning, photoresist development, material etching and removal, as well as doping treatments. These processes are performed repeatedly to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which transistors are stacked on top of each other. Fabrication of 3D semiconductor devices poses many new and unique challenges associated with scaling, post-fabrication processing, as well as other aspects of the 3D fabrication process.

SUMMARY

In the present disclosure, complementary field-effect transistor (CFET) devices are provided. The CFET devices are three-dimensionally stacked logic transistor in which either the NMOS or PMOS transistor is situate overtop its complement. The NMOS or PMOS transistor can have a channel region that includes one or more nanowires or nano sheets. The nanowires or nano sheets can be spaced apart from one another and formed laterally along a substrate. The NMOS or PMOS transistor can have source/drain regions that are positioned at two ends of the nanowires or nano sheets. A gate structure can be formed to surround the channel regions of the NMOS and PMOS.

As functional scaling is ever decreasing the size of nanowires and/or nano sheets to enable area scaling, a significant challenge lies within the drive current of a given device. Drive current can be improved, and control in complementary field-effect transition (CFET) devices can be improved through incorporation of different materials in the NMOS and PMOS channels to provide needed strain on the nanowire and/or nano sheets.

Techniques herein provide cell architecture, design concept, and corresponding methods of manufacture for complementary FET (field effect transistor) devices that have different materials in the NMOS and PMOS channels to provide highest mobility on the nanowires and/or nano sheets.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a semiconductor device is provided. The device has a first transistor pair formed over a substrate. The first transistor pair includes a n-type transistor and a p-type transistor that are stacked over one another. The n-type transistor has a first channel region that includes one or more first nano-channels with a first bandgap value. The one or more first nano-channels extend laterally along the substrate, are stacked over the substrate and spaced apart from one another. The p-type transistor has a second channel region that includes one or more second nano-channels made of a compound material having a second bandgap value based on a predetermined material ratio of the compound material. The one or more second nano-channels extend laterally along the substrate, are stacked over the substrate and spaced apart from one another. Each of the one or more first nano-channels in the first channel region and each of the one or more second nano-channels in the second channel region are surrounded by a gate structure respectively.

In some embodiments, the one or more first nano-channels include at least one of silicon or germanium. The compound material includes Germanium-Tin (GeSn) so that the predetermined material ratio includes a Sn content between 1% and 10% in the GeSn.

In some embodiments, the one or more first nano-channels can have a number N of first nano-channels, where the N is an integer from one to ten. Similarly, the one or more second nano-channels can include a number M of second nano-channels, where the M can be an integer from one to ten. The nano-channel herein means either a nano wire of a nano sheet shaped channel for a field effect transistor.

In the disclosed device, the n-type transistor further includes a first source/drain (S/D) region and a second S/D region that are made of a first material doped with phosphorous. The first S/D region and the second S/D region of the n-type transistor are positioned at two ends of the one or more first nano-channels and in direct contact with the one or more first nano-channels. In addition, the p-type transistor further includes a first source/drain (S/D) region and a second S/D region that are made of a second material doped with boron. The first S/D region and the second S/D region of the p-type transistor are positioned at two ends of the one or more second nano-channels and in direct contact with the one or more second nano-channels.

In some embodiments, the first material can include silicon. The second material can include at least one of GeSi, Ge, GePt, GeSiSn, GePtSi, GePt, SiGePt, SiGeSn, or SiGeSnPt.

In some embodiments, the n-type transistor is stacked over the p-type transistor. In some embodiments, the p-type transistor is stacked over the n-type transistor.

The device can have a second transistor pair formed over the substrate. The second transistor includes a n-type transistor and a p-type transistor. The second transistor pair is positioned at a first side of the first transistor pair. A n-channel region of the n-type transistor of the second transistor pair is coupled to a first S/D region of the n-type transistor of the first transistor pair, and a p-channel region of the p-type transistor of the second transistor pair is coupled to a first S/D region of the p-type transistor of the first transistor pair. The device can further have a third transistor pair formed over the substrate. The third transistor pair includes a n-type transistor and a p-type transistor. The third transistor pair can be positioned at a second side of the first transistor pair. A n-channel region of the n-type transistor of the third transistor pair is coupled to a second S/D region of the n-type transistor of the first transistor pair, and a p-type channel region of the p-type transistor of the third transistor pair is coupled to a second S/D region of the p-type transistor of the first transistor pair.

According to another aspect of the disclosure, a method for forming a semiconductor is provided. In the disclosed method, an epitaxial layer stack over a substrate is formed. The epitaxial layer stack includes a plurality of intermediate layers, one or more first nano layers with a first bandgap value and one or more second nano layers. The one or more second nano layers are made of a compound material having a second bandgap value based on a predetermined material ratio of the compound material. The one or more first nano layers are positioned over the one or more second nano layers and spaced apart from the one or more second nano layers by one or more of the plurality of intermediate layers. The one or more first nano layers are spaced apart from one another by one or more of the plurality of intermediate layers. The one or more second nano layers are spaced apart from one another by one or more of the plurality of intermediate layers.

In the disclosed method, a plurality of trenches can be subsequently formed in the epitaxial layer stack. The epitaxial layer stack can be separated into a plurality of sub-stacks by the plurality of trenches so that the one or more first nano layers are separated into a plurality of first nano-channels, the one or more second nano layers are separated into a plurality of second nano-channels, and each of the plurality of sub-stacks includes one or more first nano-channels and one or more second nano-channels. Further, the plurality of intermediate layers can be recessed so that the one or more first nano-channels and the one or more second nano-channels in each of the plurality of sub-stacks protrude from sidewalls of the plurality of intermediate layers. Further, a plurality of bottom source/drain (S/D) regions can then be formed in the plurality of trenches. The plurality of bottom S/D regions are made of a second material and in direct contact with the plurality of second nano-channels. Over the plurality of bottom S/D regions, a plurality of top source/drain (S/D) regions can be formed in the plurality of trenches. The plurality of bottom S/D regions are made of a first material and in direct contact with the plurality of first nano-channels.

In some embodiments, the plurality of intermediate layers includes a bottom layer that is positioned on the substrate and made of SiGe, and a plurality of upper layers that are positioned over the bottom layer. The SiGe can have a Ge content between 80% and 100%. The upper layers can includes at least one or Ge, Si, SiGe, or GeSn corresponding to the nano layers.

In some embodiments, the one or more first nano layers include at least one of silicon (Si) or germanium (Ge). The compound material can include Germanium-Tin (GeSn) so that the predetermined material ratio includes a Sn content from 1% to 10%. In some embodiments, the one or more second nano layers can be made of Ge.

The disclosed method further includes removing the intermediate layers that are positioned in each of the plurality of sub-stacks, and forming a plurality of gate structures in each of the plurality of sub-stacks so that each of the plurality of gate structures surrounds the one or more first nano-channels and the one or more second nano-channels in a respective sub-stack.

According to yet another aspect of the disclosure, a semiconductor device is provided. The disclosed device includes a plurality of transistor pairs formed over a substrate, arranged side by side, and coupled to one another, where each of the plurality of transistor pairs includes a n-type transistor and a p-type transistor that are stacked over one another.

The n-type transistor has a first channel region that includes one or more first nano-channels made of a first compound material having a first bandgap value based on a first predetermined material ratio of the first compound material, where the one or more first nano-channels extend laterally along the substrate, are stacked over the substrate and spaced apart from one another. The p-type transistor has a second channel region that includes one or more second nano-channels made of a second compound material having a second bandgap value based on a second predetermined material ratio of the second compound material, where the one or more second nano-channels extend laterally along the substrate, are stacked over the substrate and spaced apart from one another. Each of the one or more first nano-channels in the first channel region of the n-type transistor and each of the one or more second nano-channels in the second channel region of the p-type transistor are surrounded by a gate structure respectively In the disclosed device, the n-type transistor includes a first source/drain (S/D) region and a second S/D region. The first S/D region and the second S/D region of the n-type transistor are positioned at two ends of the one or more first nano-channels and in direct contact with the one or more first nano-channels. At least one of the first S/D region and the second S/D region of the n-type transistor is coupled to a first channel region of an adjacent n-type transistor. The p-type transistor further includes a first source/drain (S/D) region and a second S/D region. The first S/D region and the second S/D region of the p-type transistor are positioned at two ends of the one or more second nano-channels and in direct contact with the one or more second nano-channels. At least one of the first S/D region and the second S/D region of the p-type transistor is coupled to a second channel region of an adjacent p-type transistor.

In some embodiments, the first compound material includes first Germanium-Tin (GeSn) so that the first predetermined material ratio includes a Sn content between 1% and 6%. The second compound material includes second Germanium-Tin (GeSn) so that the second predetermined material ratio includes a Sn content between 1% and 10%.

In the present disclosure, a novel device structure is provided, where difference materials can be applied to the n-type transistor and the p-type transistor in the CFET devices. The difference materials provide appropriate carriers' mobility in the channel regions of the n-type and p-type transistors respectively. For example, Ge, or GeSn can be applied in the channel region of the n-type transistor, which provides a larger electrons' mobility in the channel region than a Si channel region. Similarly, Ge or GeSn can be applied in the channel region of the p-type transistor which can enhance the holes' mobility in the channel region comparing with a traditional Si channel region. Accordingly, a more efficient Idsat (saturation current) for NMOS and PMOS can be achieved due to the mobility enhancement.

Further, the bandgap of the channel regions in the n-type transistor or p-type transistor can be adjusted by varying a Sn content in the GeSn. The GeSn with a different Sn can result in a different bandgap, and accordingly the carriers' mobility can be adjusted to meet the device requirements.

In the disclosed device, building blocks can be created for each CFET for a better optimization of CFET's performance. In a first example, a Si channel can be applied for NMOS, and a GeSn channel for PMOS, which results in a standard performance NMOS, and a high performance PMOS. In a second example, a Ge channel can be applied for NMOS, and a Ge channel can be applied for PMOS, which results in a high performance NMOS, and a high performance PMOS. In a third example, a GeSn channel can be applied for NMOS, and a GeSn channel can be applied for PMOS, which results in a high performance NMOS, and a higher performance PMOS.

Further, transistor architectures can enable N=1 to N=>10 nano-channel planes of transistors depending on circuit requirements. Different materials (e.g., Si, Ge, or GeSn) in the nano-channels can be defined for etch selectivity for NMOS and PMOS devices.

In the present disclosure, a novel method is also provided to fabricate the disclose device. In the disclosed method, an epitaxial layer stack can be formed, where the channel regions of the n-type and p-type transistor can be positioned. The epitaxial layer stack can include a plurality of channel layers (e.g., Si, Ge, or GeSn) and a plurality of intermediate layers. The intermediate layers are formed between the channel layer so that the channel layers are spaced apart from one another. By selecting appropriate materials (e.g., Ge, Si, SiGe, or GeSn) corresponding to the channel layers during formation of the intermediate layers, the intermediate layers can be etched faster than the channel layers. The channel layers accordingly protrude from side walls of the intermediate layers, and function as the channel regions. The disclosed method requires no new mask for process steps (e.g., forming the channel region) as compared to a related CFET process flow.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
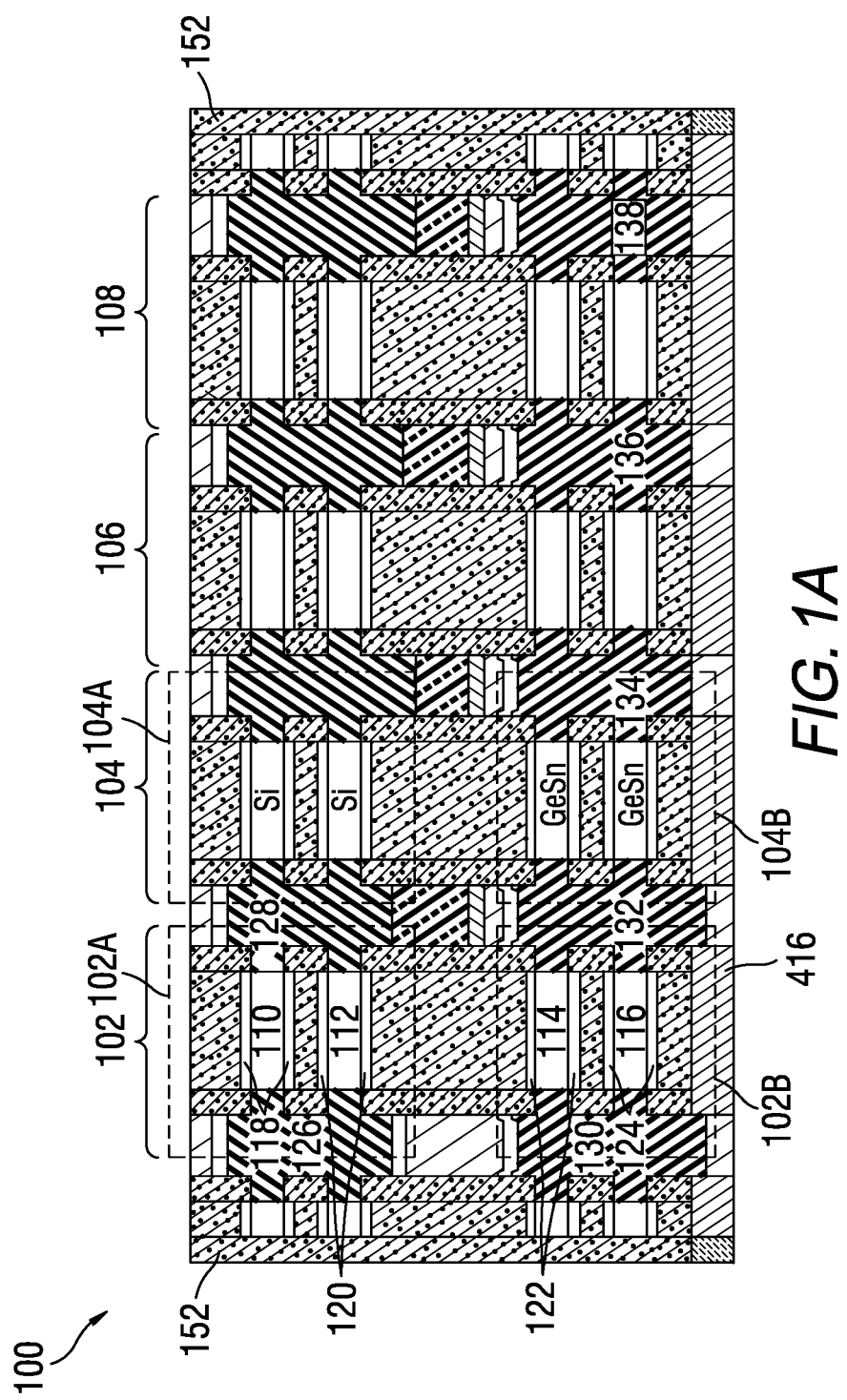
FIG. 1A is a first cross-sectional view of a CFET device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

The disclosure is related to making 3D transistors using multiple selective nano-channels for fabrication in different device regions (i.e., NMOS, PMOS). By changing the nano-channel material construction, the transistor performance can be increased.

FIG. 1A illustrates a first cross-sectional view of a CFET device 100 that has different materials in channel regions. FIG. 1A shows a first embodiment of the CFET 100. As shown in FIG. 1A, a CFET device 100 is provided. The CFET device 100 can include a plurality of transistor pairs formed over a substrate (not shown). For example, four transistor pairs 102-108 can be included in the device 100. Each of the transistor pairs can include a n-type transistor and a p-type transistor that are stacked over one another. In some embodiments, the n-type transistor is positioned over the p-type transistor. In some embodiment, the p-type transistor is positioned over the n-type transistor. In an embodiment of FIG. 1A, the n-type transistor is positioned over the p-type transistor. For example, the transistor pair 102 has a n-type transistor 102A and a p-type transistor 102B. The n-type transistor 102A is positioned over the p-type transistor 102B.

In the disclosed device 100, the n-type transistor can have a first channel region that includes a number N of first nano-channels, where the N can be an integer from one to ten. The p-type transistor can have a second channel region that includes a number M of second nano-channels, where the M can be an integer from one to ten. The first and second nano-channels can be formed laterally along a top surface of the substrate (not shown) and arranged in parallel. The first nano-channels can be spaced apart from one another. The second nano-channels can also be spaced apart from one another. For example, as shown in FIG. 1A, the n-type transistor 102A can include two first nano-channels 110 and 112 that are spaced apart from each other. The p-type transistor 102B can include two second nano-channels 114 and 116 that are also spaced apart from each other. In some embodiments, the first and second channel regions can be made of different materials that have different bandgaps. For example, the first channel region can be made of silicon having a fixed bandgap around 1.11 eV at 300K. The second channel region can be made of a compound material, such as Germanium Tin (GeSn) with a Sn content between 1% and 10%. The GeSn can have an adjustable bandgap by changing the Sn content. For example, the GeSn can have a bandgap around 0.5 eV when the Sn is 10% and a bandgap around 0.75 eV when the Sn is 2%.

The nano-channel herein means either a nano wire or a nano sheet shaped channel for a field effect transistor. A nanowire is a relatively small elongated structure formed having a generally circular cross section or rounded cross section. Nanowires are often formed from layers that are pattern etched to form a channel having a generally square cross-section, and then corners of this square cross-section structure are rounded, such as be etching, to form a cylindrical structure. A nano sheet is similar to a nanowire in that it is a relatively small cross section (less than a micron and typically less than 30 nanometers), but with a cross section that is rectangular. A given nano sheet can include rounded corners.

During at least one point during the formation or processing of a nano-channel (wire or sheet), the given nano-channel is uncovered on all sides, including a bottom side. This differs from "planar" transistor channels which typically have at least one side that is on bulk silicon (or other material) and that always remains covered (another material in contact with it) during microfabrication. Planar channels enable a gate structure to essentially contact one side or two sides or three sides, but not all sides or surfaces. In contrast, nanowires and nano sheets enable gate-all-around (GAA) channels. Thus, a nano-channel herein can have various cross sections, but enables a gate to be formed all around the channel structure.

The n-type transistor can further include a first source/drain (S/D) region and a second S/D region that are positioned at two ends of the first channel region and in direct contact with the first channel region. In some embodiments, the first and second S/D regions of the n-type transistor can be made of a first material doped with phosphorous. The first material can be silicon, for example. The p-type transistor can include a first S/D region and a second S/D region that are positioned at two ends of the second channel region and in direct contact with the second channel region. In some embodiments, the first S/D region and the second S/D region of the p-type transistor can be made of a second material. The second material can include GeSi, Ge, GePt, GeSiSn, GePtSi, GePt, SiGePt, SiGeSn, or SiGeSnPt. For example, as shown in FIG. 1A, the n-type transistor 102A can have a first S/D region 126 and a second S/D region 128, which are positioned at two ends of the first nano-channels 110 and 112, and in direct contact with the first nano-channels 110 and 112. The p-type transistor 102B has a first S/D region 130 and a second S/D region 132, which are positioned at two ends of the second nano-channels 114 and 116, and in direction contact with the second nano-channels 114 and 116.

The n-type transistor and the p-type transistor can also have a gate structure respectively. The gate structure can be formed to surround the channel regions. For example, the n-type transistor can have gate structures 118 and 120 that surround the first nano-channels 110 and 112 respectively. The p-type transistor can have gate structures 122 and 124 that surround the second nano-channels 114 and 116 respectively.

In the disclosed device 100, the plurality of transistor pairs can be formed side by side, and coupled to each other. For example, the transistor pair 102 is coupled to the transistor pair 104, where the second S/D region 128 of the n-type transistor 102A in the transistor pair 102 can function as a first S/D region of the n-type transistor 104A in the transistor pair 104, and be coupled to a first channel region of the n-type transistor 104A. Similarly, the second S/D region 132 of the p-type transistor 102B in the transistor pair 102 can function as a first S/D region of the p-type transistor 104B in the transistor pair 104, and be coupled to a second channel region of the p-type transistor 104B.

Figure 1B:
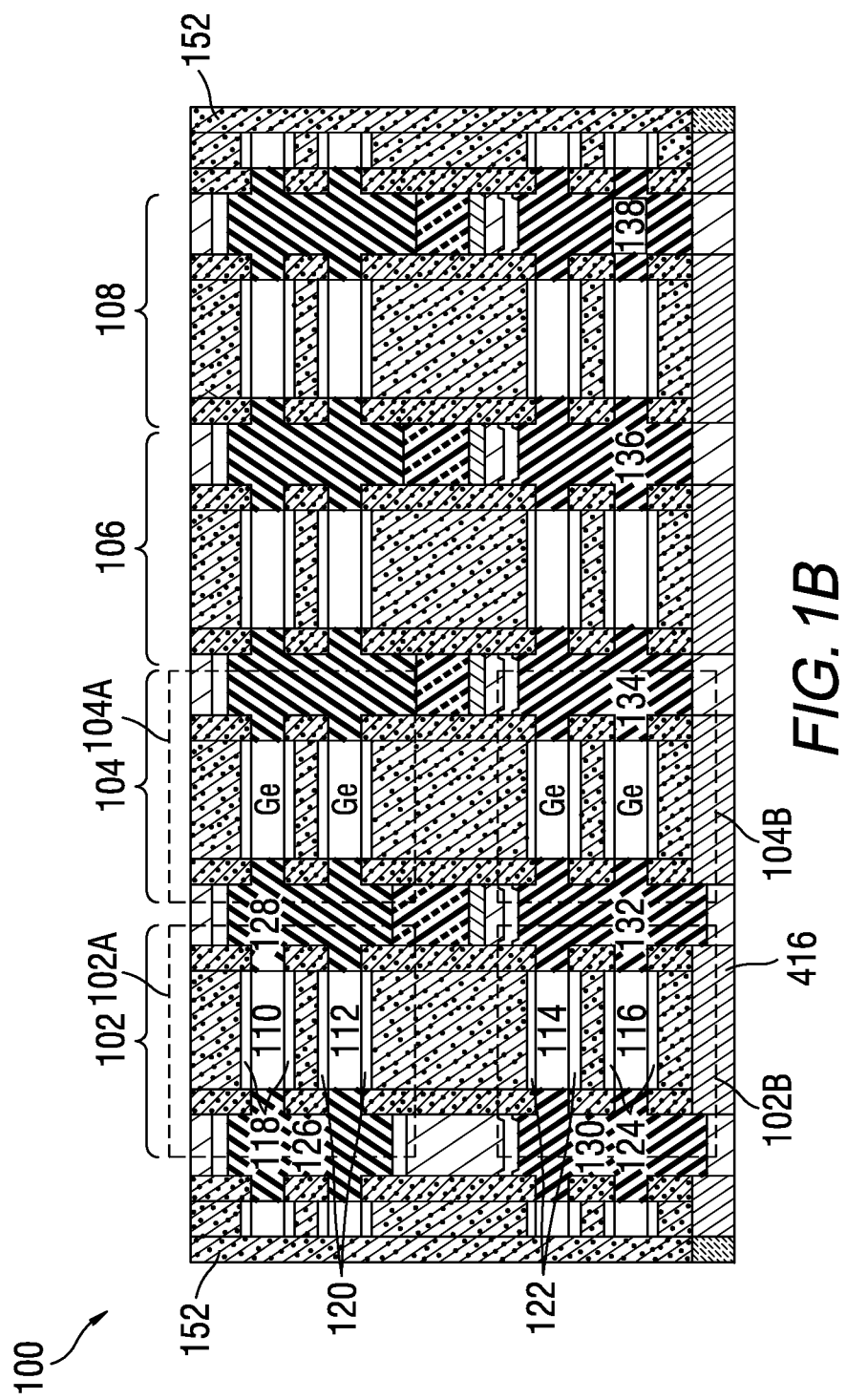
FIG. 1B is a second cross-sectional view of a CFET device, in accordance with some embodiments.
Figure 1C:
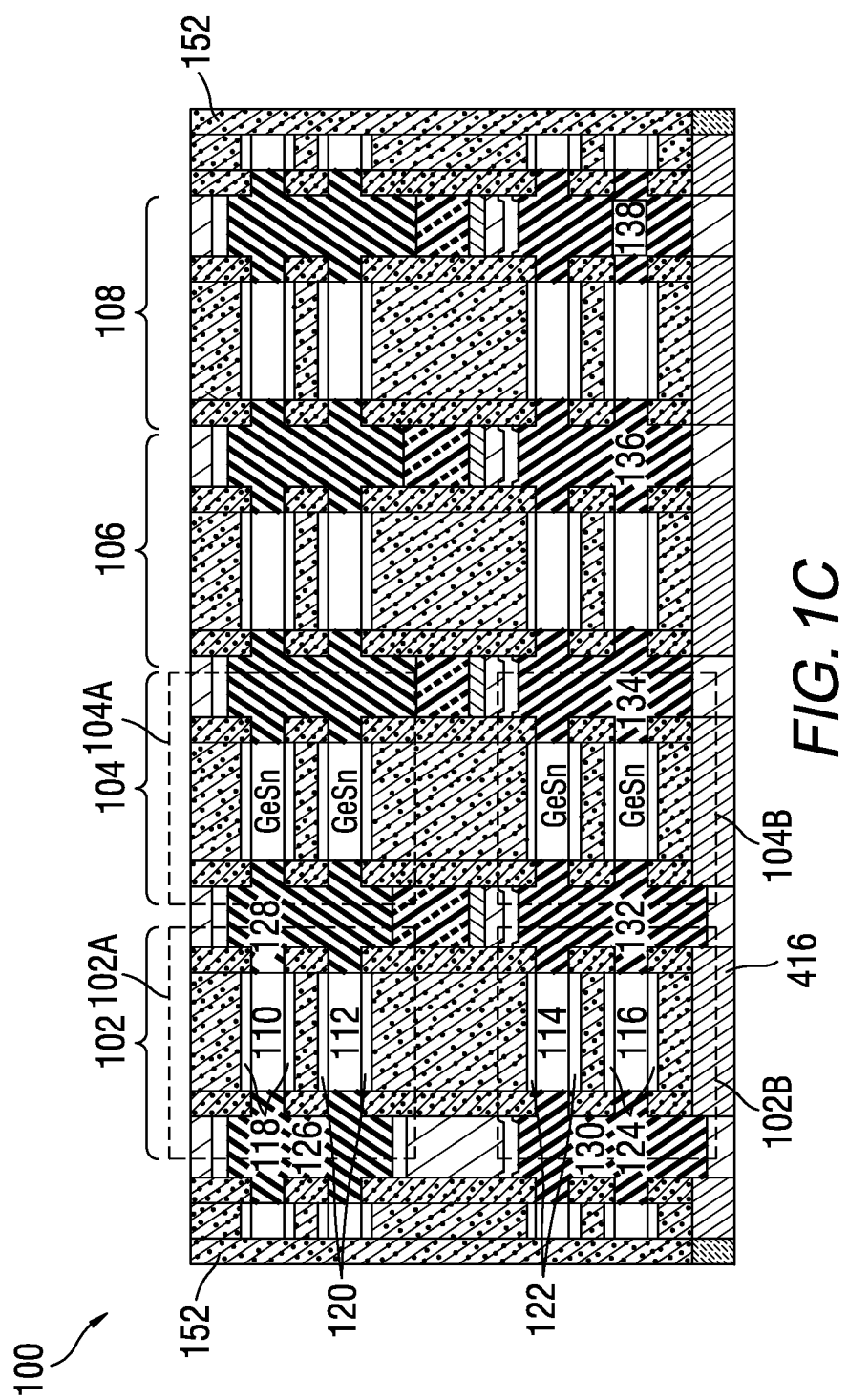
FIG. 1C is a third cross-sectional view of a CFET device, in accordance with some embodiments.

FIG. 1B illustrates a second cross-sectional view of a CFET device 100 that has different materials in channel regions. FIG. 1B shows a second embodiment of the CFET 100. As shown in FIG. 1B, the first nano-channels (e.g., 110 and 112) of the n-type transistor are made of Ge, and the second nano-channels (e.g., 114 and 116) of the p-type transistor are made of Ge. FIG. 1C illustrates a third cross-sectional view of a CFET device 100 that has different materials in channel regions. FIG. 1C shows a third embodiment of the CFET 100. As shown in FIG. 1C, the first nano-channels (e.g., 110 and 112) of the n-type transistor are made of a first compound material, such as GeSn that has a Sn content between 1% and 6%, and the second nano-channels (e.g., 114 and 116) of the p-type transistor are made of a second compound material, such as GeSn that has a Sn content between 1% and 10%.

Figure 2A:
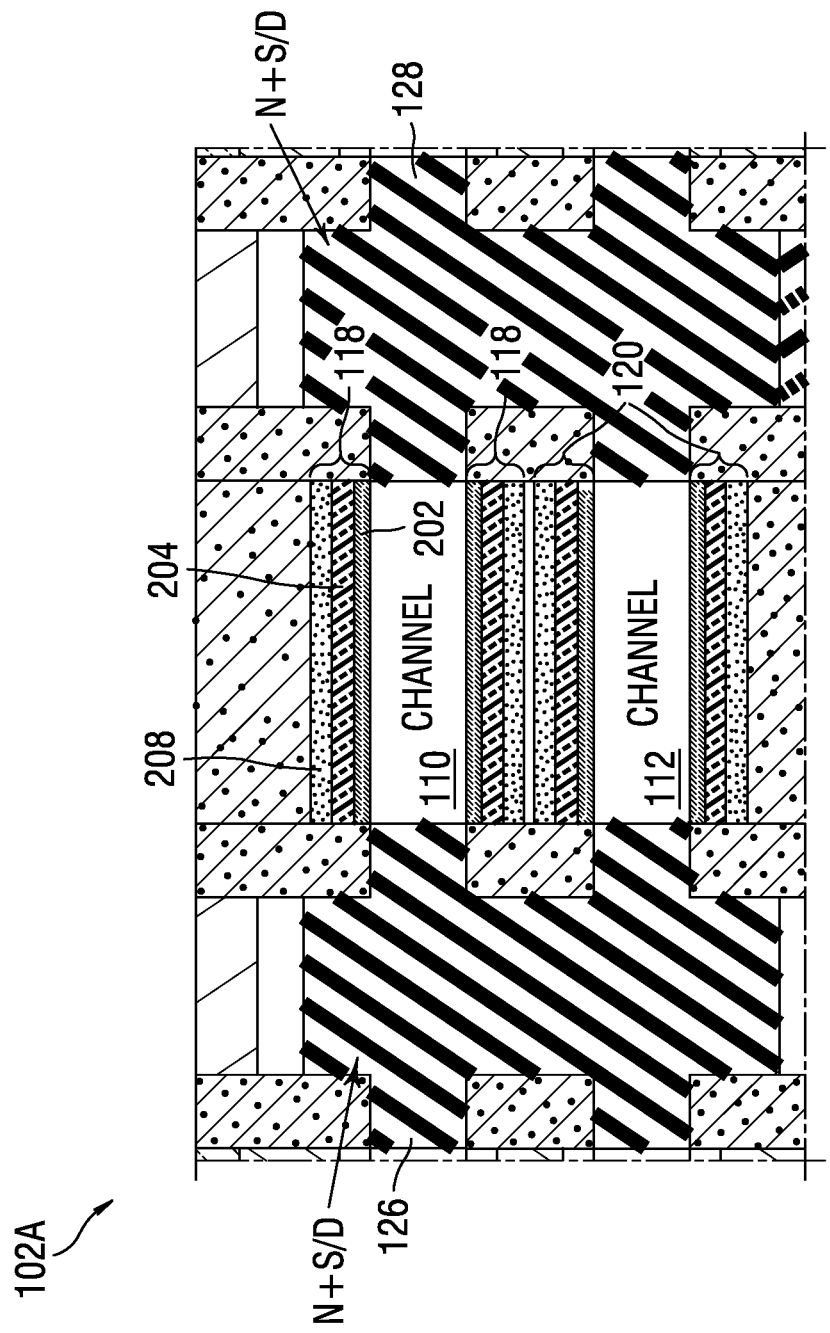
FIG. 2A is an expanded view of a gate structure of a n-type transistor in a CFET device, in accordance with some embodiments.

FIG. 2A is an expanded view of the gate structure of the n-type transistor 102A. As shown in FIG. 2A, the channel region of the n-type transistor 102A can include the two first nano-channels 110 and 112. Each of the first nano-channels can have a respective gate structure that surrounds the nano-channels. For example, the first nano-channel 110 can have a surrounded gate structure 118 and the first nano-channel 112 can have a surrounded gate structure 120. The gate structure 118 can include a first dielectric layer 202 that surrounds the first nano-channel 110 and in direct contact with the first nano-channel 110. The gate structure 118 can have a second dielectric layer 204 that is formed over the first dielectric layer 202. The gate structure 118 can also have a metal gate stack 208 positioned over the second dielectric layer 204. In some embodiments, the first dielectric layer 202 can be an interfacial oxide layer, such as $SiO_2$. The second dielectric layer 204 can be a high-k layer, such as $HfO_2$, and the metal gate stack 208 can include a TiC layer positioned over the second dielectric layer 204.

Figure 2B:
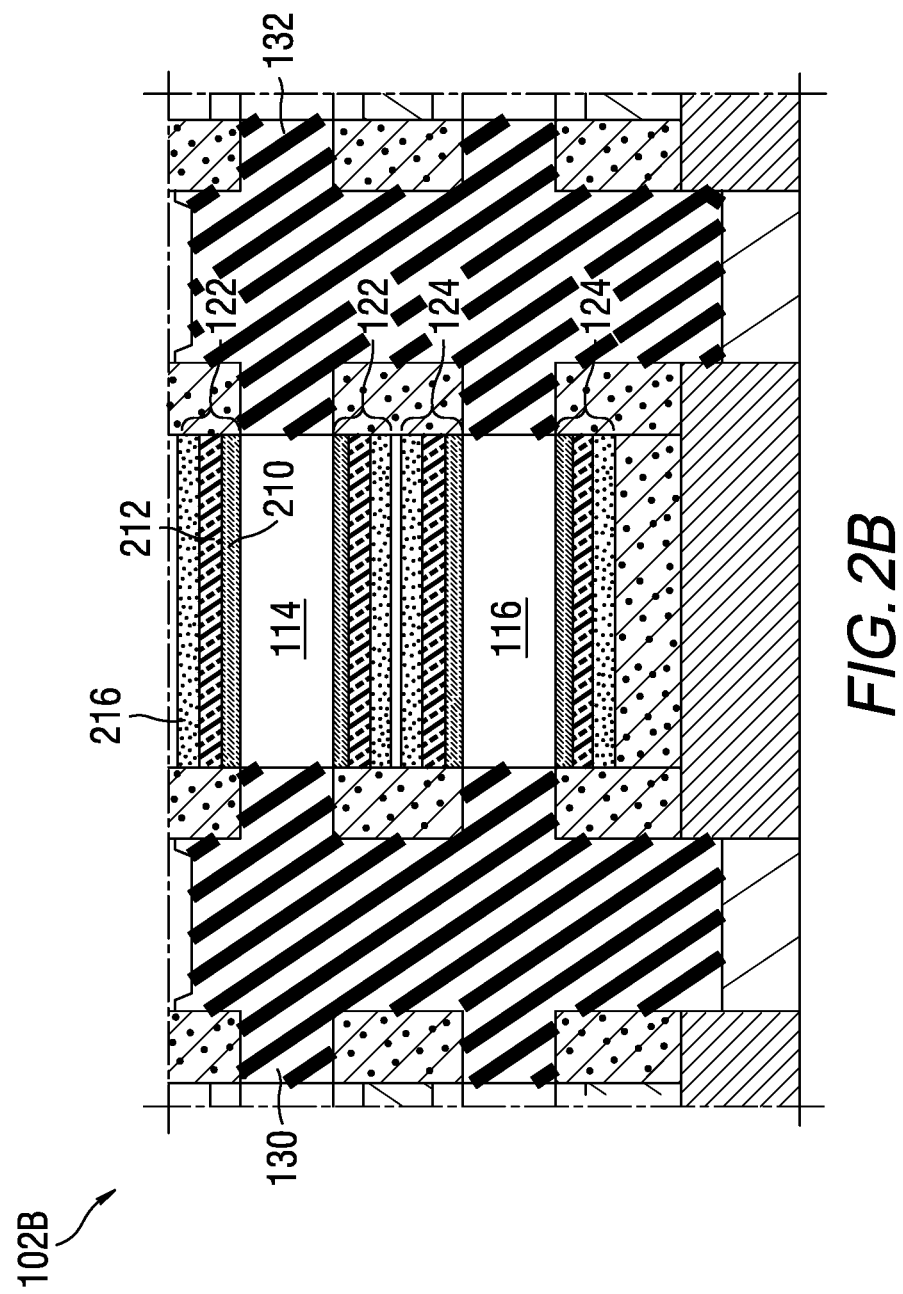
FIG. 2B is an expanded view of a gate structure of a p-type transistor in a CFET device, in accordance with some embodiments.

FIG. 2B is an expanded view of the gate structure of the p-type transistor 102B. As shown in FIG. 2B, the channel region of the p-type transistor 102B can include the two second nano-channels 114 and 116. Each of the second nano-channels can have a respective gate structure that surrounds the second nano-channels. For example, the second nano-channel 114 can have a surrounded gate structure 122 and the second nano-channel 116 can have a surrounded gate structure 124. The gate structure 122 can include a first dielectric layer 210 that surrounds the second nano-channel 114 and in direct contact with the second nano-channel 114. The gate structure 122 can have a second dielectric layer 212 that is formed over the first dielectric layer 210. The gate structure 122 can also have a metal gate stack 216 positioned over the second dielectric layer 212. In some embodiments, the first dielectric layer 210 can be an interfacial oxide layer, such as $SiO_2$. The second dielectric layer 212 can be a high-k layer, such as $HfO_2$, $Al2O3$, $Y_2O_3$, $ZrO_2$, or the like. The metal gate stack 216 can include a TiC layer positioned over the second dielectric layer 212, a TaN layer positioned over the TiN layer, a TiON layer positioned over the TaN layer, and a TiC layer positioned over the TaN layer.

It should be noted that FIGS. 2A and 2B are merely examples of the gate structures in the device 100. The gate structures can further include gate electrodes. The gate electrodes can include a TiN liner formed over the metal gate stack, and a conductive layer (e.g., tungsten, cobalt) formed over the TiN liner. In addition, the gate structures can include less or more layers than the layers illustrated in FIGS. 2A and 2B according to the device designs.

Figure 3:
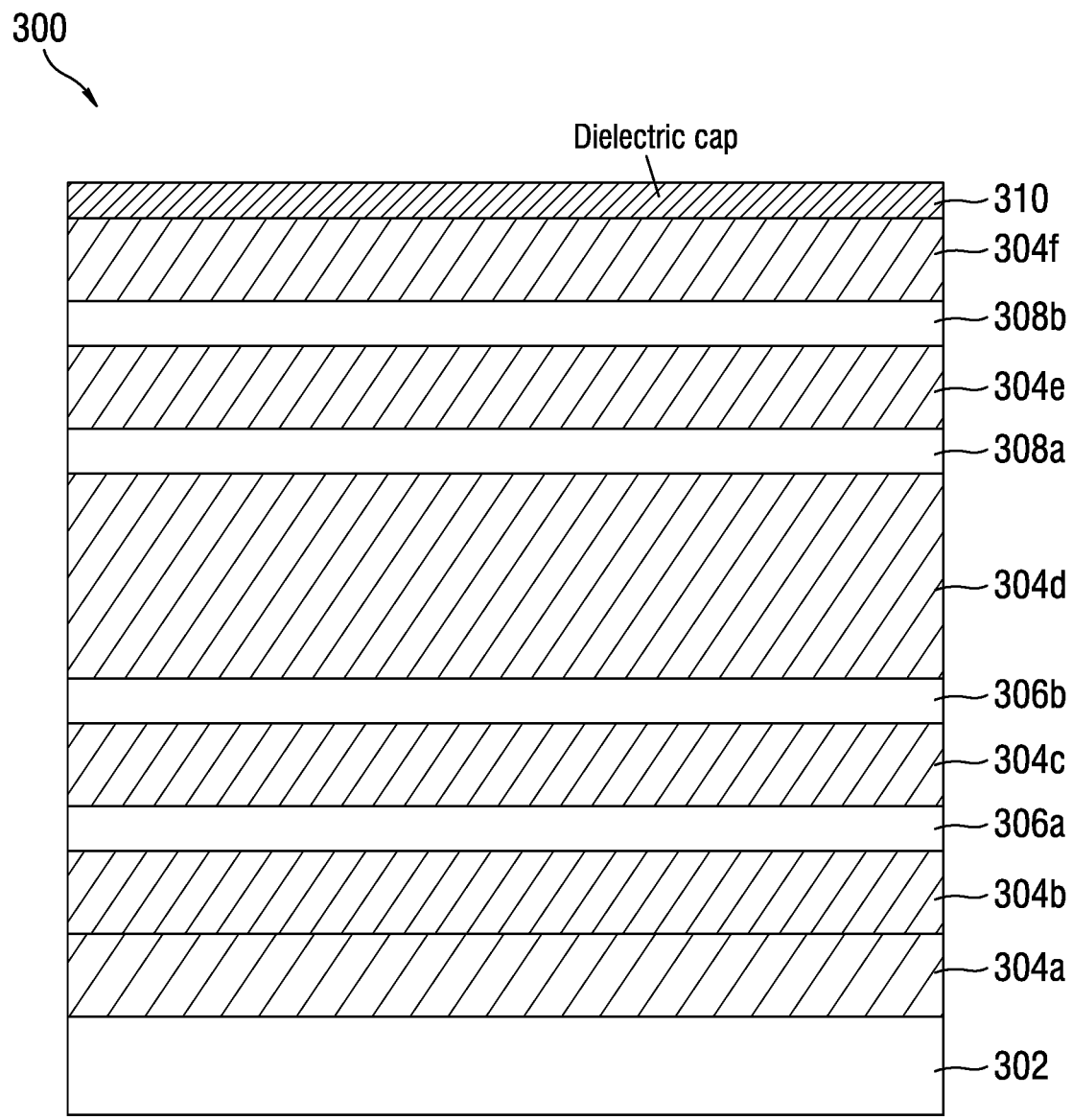
FIGS. 3-8 are cross-sectional views of various exemplary intermediate steps of manufacturing a CFET device, in accordance with some embodiments.

FIGS. 3-8 are cross-sectional views of various exemplary intermediate steps of manufacturing a CFET device, in accordance with some embodiments. As shown in FIG. 3, an epitaxial layer stack 300 can be formed over a substrate 302. The epitaxial layer stack 300 can include a plurality of intermediate layers 304a-304f, one or more first nano layers 308a-308b and one or more second nano layers 306a-306b. The first nano layers 308a-308b can be positioned over the second nano layers 306a-306b and spaced apart from the second nano layers by one or more of the intermediate layers. For example, the first nano layers 308a-308b and the second nano layers 306a-306b are separated by an intermediate layer 304d. The first nano layers can be spaced apart from one another by one or more of intermediate layers. As shown in FIG. 3, the first nano layers 308a-308b are spaced apart from one another by an intermediate layer 304e. The second nano layers 306a-306b can be spaced apart from one another by one or more intermediate layers. For example, as shown in FIG. 3, the second nano layers 306a-306b are separated by an intermediate layer 304c.

In some embodiment, the intermediate layers can include a bottom layer that is positioned on the substrate and a plurality of upper layers positioned over the bottom layer. As shown in FIG. 3, a bottom layer 304a can be formed on the substrate 302. The bottom layer can be made of SiGe that includes a Ge content between 80% and 100%. When the Ge content is 100%, the bottom layer is actually made of Ge. A plurality of upper layers 304b-304f can be positioned over the bottom layer 304a. In some embodiments, the epitaxial layer stack 300 can further include an oxide cap layer 310 that is configured to protect the underlying layers during the subsequent manufacturing processes.

In the present disclosure, an appropriate material for the upper layers can be selected corresponding to the channel layers to achieve an etch selectivity between the upper layers and the channel layer so that the intermediate layers can be etched faster than the channel layers. In a first example, the upper layers 304b-304f can be made of Ge, the second nano layers 306a and 306b can be made of GeSn with a Sn content between 1% and 10%, and the first nano layers 308a and 308b can be made of Si. In a second example, the upper layers 304b-304f can be made of Si, the second nano layers 306a and 306b can be made of Ge, and the first nano layers 308a and 308b can be made of Ge. In a third example, the upper layers 304b-304f can be made of SiGe, the second nano layers 306a and 306b can be made of Ge, and the first nano layers 308a and 308b can be made of Ge. In a fourth example, the upper layers 304b-304f can be made of GeSn, the second nano layers 306a and 306b can be made of Ge, and the first nano layers 308a and 308b can be made of Ge. In a fifth example, the upper layers 304b-304f can be made of Ge, the second nano layers 306a and 306b can be made of GeSn with a Sn content between 1% and 10%, and the first nano layers 308a and 308b can be made of GeSn with a Sn content between 1% and 6%. In a sixth example, the upper layers 304b-304f can be made of Si, the second nano layers 306a and 306b can be made of GeSn with a Sn content between 1% and 10%, and the first nano layers 308a and 308b can be made of GeSn with a Sn content between 1% and 6%.

Any suitable method can be applied to form the epitaxial layer stack 300. For example, the method can include chemical vapor deposition (CVD), physical vapor deposition (PVD), diffusion, atomic layer deposition (ALD), low pressure CVD, or other suitable deposition methods.

Figure 4:
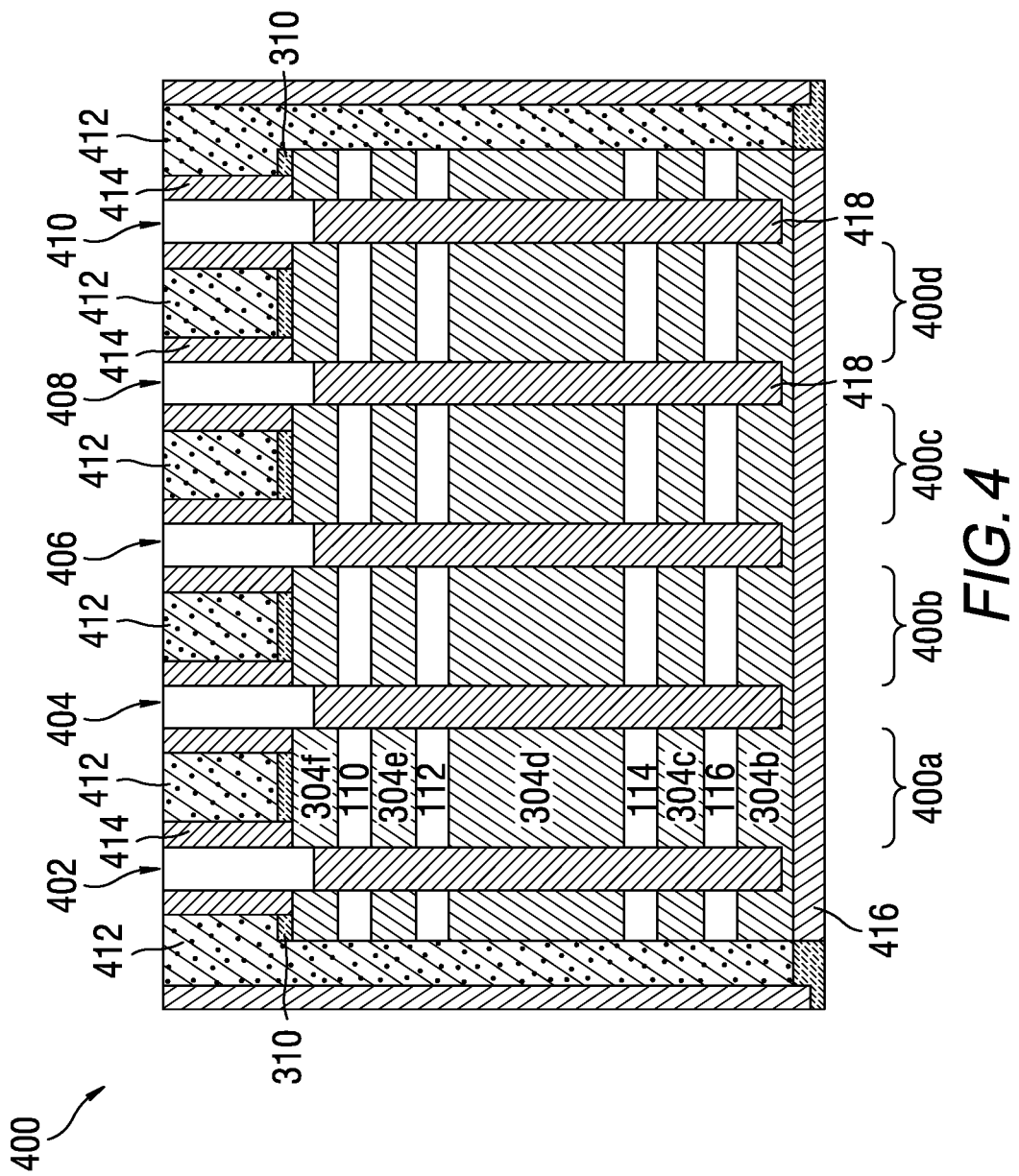

In FIG. 4, a plurality of trenches can be formed in the epitaxial layer stack 300 through a patterning technique. The patterning technique can include a photolithography process and an etching process. The photolithography process can form a mask stack on the epitaxial layer stack, and further form a plurality of patterns in the mask stack. The etching process can transfer the patterns into the epitaxial layer stack to form the plurality of trenches. As shown in FIG. 4, five trenches 402-410 can be formed in the epitaxial layer stack 300. The epitaxial layer stack 300 can be separated into a plurality of sub-stacks 400a-400d by the trenches 402-410 so that the first nano layers 308a-308b are separated into a plurality of first nano-channels (e.g., 110, 112), the second nano layers 306a-306b are separated into a plurality of second nano-channels (e.g., 114 and 116), and each of the sub-stacks includes one or more first nano-channels and one or more second nano-channels. For example, the sub-stack 420a can include two first nano-channels 110 and 112, and two second nano-channels 114 and 116. Moreover, two ends of the nano-channels can be exposed in the trenches.

Figure 5:
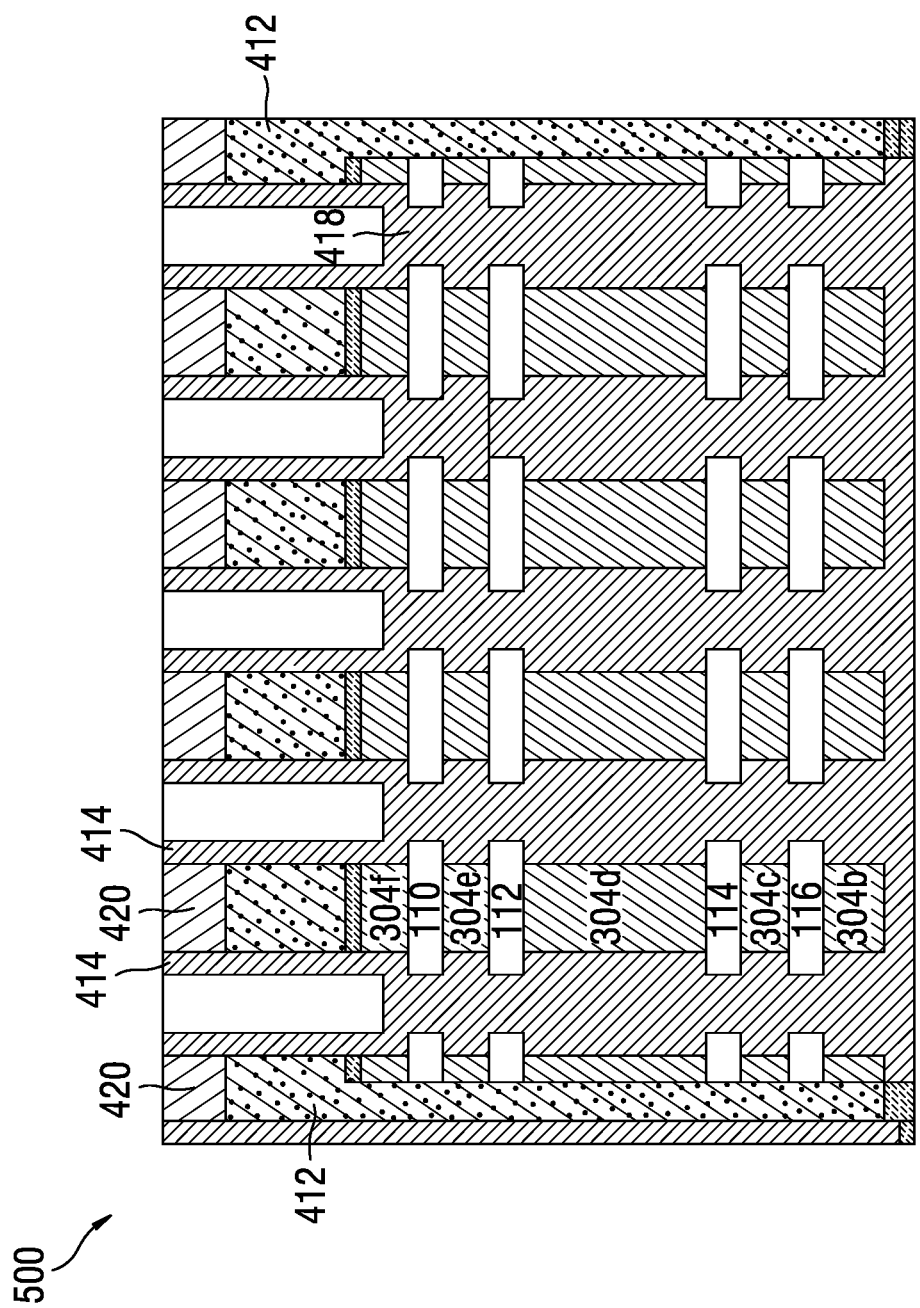

Still referring to FIG. 4, the mask stack can include an amorphous Si (a-Si) layer 412 that is positioned over the oxide cap layer 310, a SiN layer (420, as shown in FIG. 5) and a resist layer (not shown). A plurality of spacers 414 can be formed along sidewalls of the a-Si layer 412. In addition, a plurality of inner spacers 418 can be formed in the trenches. Moreover, it should be noted that the bottom layer 304a can be removed and replaced with an oxide layer 416. In some embodiment, the spacers 414 can be an oxide layer, such as $SiO_2$, and the inner spacer 418 and the oxide layer 416 can also be made of $SiO_2$.

In FIG. 5, the plurality of intermediate layers 304b-304f can be recessed by an etching process, such as a dry etch process or a wet etch process. As mentioned above, appropriate materials for the intermediate layers 304b-304f can be selected corresponding to the channel layers 306 and 308 to achieve an etch selectivity between the intermediate layers and the channel layer so that the intermediate layers can be etched faster than the channel layers. When the etching process is completed, a portion of the intermediate layers can be removed, and sidewalls of the intermediate layers can be accordingly recessed. The first/second nano-channels can also be etched during the etching process, but a removal amount can be very little. Accordingly, the first nano-channels and second nano-channels in each of sub-stacks can protrude from the sidewalls of the intermediate layers. For example, the first nano-channels 110 and 112 can protrude from sidewalls of the intermediate layers 304d-304f, and the second nano-channels 114 and 116 can protrude from sidewalls of the intermediate layers 304b-304d.

Figure 6:
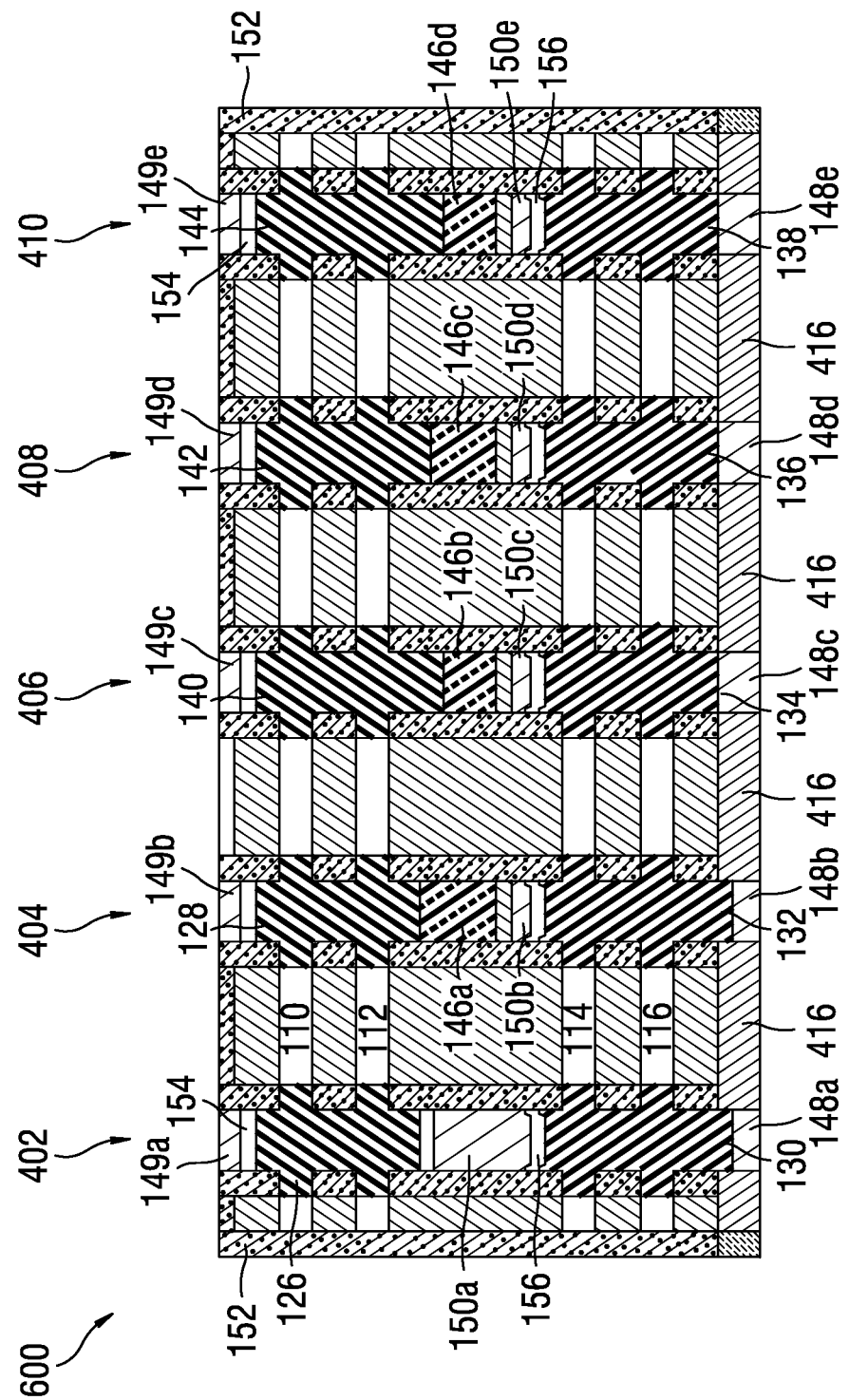

In FIG. 6, a plurality of bottom source/drain (S/D) regions 130-138 can be formed in the trenches 402-410. The bottom S/D regions 130-138 can be in direct contact with the second nano-channels and function as S/D regions of the p-type transistors. For example, the bottom S/D regions 130 and 132 can be the first S/D region 130 and the second S/D region 132 of the p-type transistor 102B that is shown in FIGS. 1A-1C. When the bottom S/D drains are formed, a plurality of top source/drain (S/D) regions 126, 128, and 140-144 can be formed in the plurality of trenches. The top S/D regions can be in direct contact with the first nano-channels and function as S/D regions of the n-type transistors. For example, the top S/D regions 126 and 128 can be the first S/D region 126 and the second S/D region 128 of the n-type transistor 102A that is shown in FIG. 1.

In some embodiments, the top S/D regions can be made of a first material doped with phosphorous, and the bottom S/D regions can be made of a second material doped with boron. The first material can be silicon, and the second material can be one of GeSi, Ge, GePt, GeSiSn, GePtSi, GePt, SiGePt, SiGeSn, or SiGeSnPt. Any suitable method can be applied to form the bottom and top S/D regions. For example, the method can include chemical vapor deposition (CVD), physical vapor deposition (PVD), diffusion, atomic layer deposition (ALD), low pressure CVD, or other suitable deposition methods.

Still referring to FIG. 6, a plurality of local interconnects 146a-146d can be formed in over the bottom S/D regions. The local interconnects can be coupled to the bottom S/D regions or the top S/D regions according to the circuit designs. The local interconnects 146a-146d can be made of Pt, Ru, Ti, TiN, W, Ni, Cu, CuMn, CuAl, MoW or stacks/combinations of these metals as examples. In addition, a plurality of bottom oxide layers 148a-148e can be formed between the bottom S/D regions and the substrate (not shown), a plurality of top oxide layers 149a-149e can be formed over the top S/D regions, and a plurality of middle oxide layers 150a-150e can be positioned between the bottom and top S/D regions to separate the bottom and top S/D regions from each other. It should be noted that during the formation of the bottom and top S/D regions, the inner spacer 418 can be removed and an oxide layer 152 can be formed when the formation of the bottom and top S/D regions are completed. In addition, a plurality bottom cap layers 156 can be formed over the bottom S/D regions, and a plurality of top cap layer 154 can be formed over the top S/D regions to prevent the dopant loss. In some embodiments, the top cap layers 154 and 156 can be made of oxide or nitride, and formed by a selectively ALD deposition.

Figure 7:
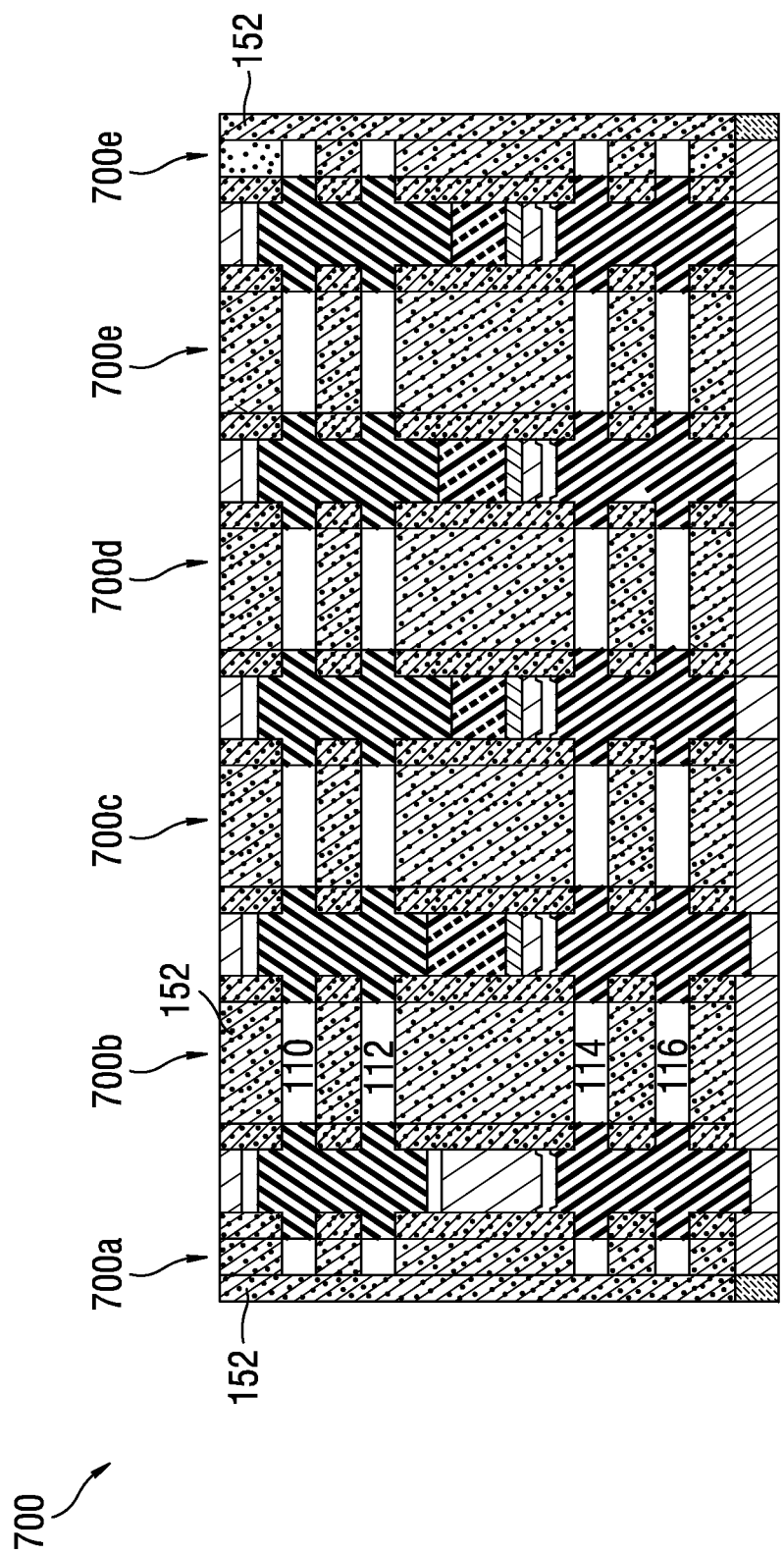

In FIG. 7, an etching process can be applied to remove the intermediate layers so that a plurality of trenches 700a-700f can be formed. When the trenches 700 are formed, the first nano-channels and the second nano-channels are exposed in the trenches 700 accordingly. The etching process can be a dry etch process or a wet etch process. The etching process can be a selective etching that preferably remove the intermediate layers and etch the first/second nano-channels in a very little amount. As mentioned above, the intermediate layers can be made of appropriate materials that have a higher etch rate than the nano-channels. Accordingly, a selective removal of the intermediate layers can be obtained.

In some embodiments, following the nano-channels release/exposure, a forming gas anneal can be operated at a processing temperature less than 400° C. The anneal process is configured to anneal the nano-channels so as to enhance the surface properties and reduce any dislocations.

Figure 8:
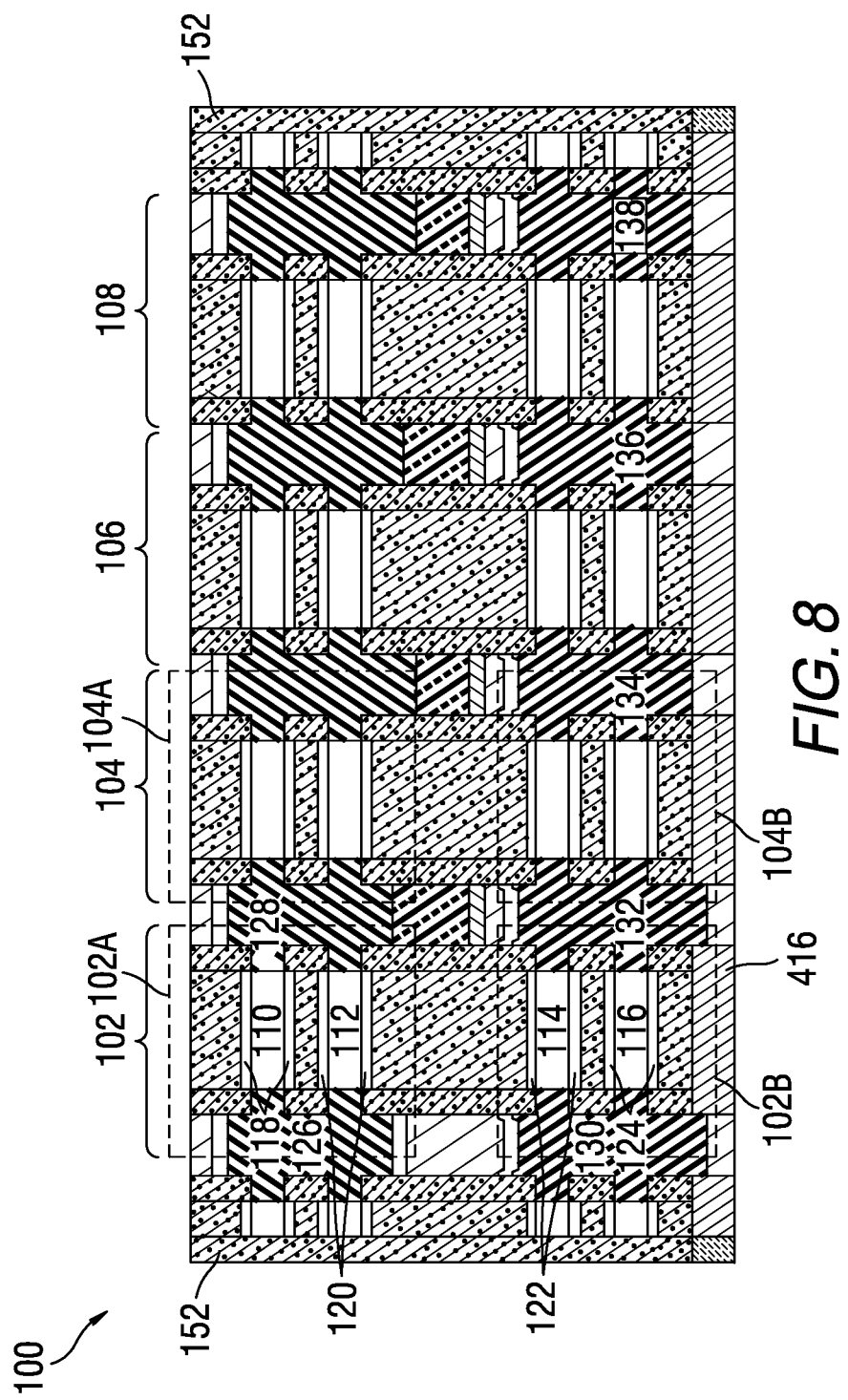

In FIG. 8, a plurality of gate structures, such as the gate structures 118-124, can be formed by depositing a plurality of dielectric layers and a metal gate stack into the trenches 700. The dielectric layers and the metal stack can be deposited to surround the first/second nano-channels and function as the gate structures. Similar to FIGS. 2A and 2B, the dielectric layers can include a first dielectric layer that is formed on the nano-channels, a second dielectric layer that is a high-k layer and formed over the first dielectric layer. In the present disclosure, an appropriate high-k layer can be deposited so as to be compatible with the metal gate to get the optimum work functions and combinations of stacks with $SiO_2$ (e.g., the first dielectric layer) and other dielectric combinations. The second dielectric layer can be a high-k layer made of $Al_2O_3$, $Y_2O_3$, $HfO_2$, $ZrO_2$, or the like. The metal gate stack can include one or more conductive layers (e.g., TiN, TaN, TiAl) and be positioned over the second dielectric layer. The dielectric layers and the metal stack can be formed by a CVD process, a PVD process, an ALD process, a diffusion process, a sputtering process, or other suitable processes.

Once the formation of the gate structures are completed, the CFET device 100 that is illustrated in FIGS. 1A-1C can be formed in FIG. 8. It should be noted that additional steps can be provided. For example, a plurality of gate electrodes (not shown) can be formed in the trenches. The gate electrodes can surround the gate structures and further be coupled to additional interconnect structures metallization layers having conductive lines and/or vias). Further, a plurality of silicides, such as $TiSi_2$, $CoSi_2$, $NiPtSi_2$, or $PtSi_2$ can be formed over the S/D regions. A plurality of S/D local interconnects (e.g., 146a-146d) can be formed to over the silicides. Such interconnect structures (e.g., gate electrodes, and S/D local interconnects) electrically connect the semiconductor device 100 with other contact structures and/or active devices to form functional circuits. Additional device features such as passivation layers, input/output structures, and the like may also be formed.

The various embodiments described herein offer several advantages over related examples. For example, difference materials can be applied to the n-type transistor and the p-type transistor in the CFET devices. The difference materials provide appropriate carriers' mobility in the channel regions of the n-type and p-type transistors respectively. In addition, in order to form the CFET devices, an epitaxial layer stack can be formed. The epitaxial layer stack can include channel layers and intermediate layers positioned between the channel layers. By selecting appropriate materials, the intermediate layer can be etched faster than the channel layers. By using such an etch selectivity, the intermediate layers can be removed and leave behind the channel layers. The channel layers accordingly protrude from side walls of the intermediate layers, and function as the channel regions. The disclosed method requires no new mask for process steps (e.g., forming the channel regions) as compared to a related CFET process flow.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of forming a semiconductor device, comprising:
    forming an epitaxial layer stack over a substrate, the epitaxial layer stack including a plurality of intermediate layers, one or more first nano layers with a first bandgap value and one or more second nano layers that are positioned below the one or more first nano layers and spaced apart from the one or more first nano layers by one or more of the plurality of intermediate layers, the one or more second nano layers being made of a compound material having a second bandgap value based on a predetermined material ratio in the compound material, the one or more first nano layers being spaced apart from one another by one or more of the plurality of intermediate layers, the one or more second nano layers being spaced apart from one another by one or more of the plurality of intermediate layers;
    forming a plurality of trenches in the epitaxial layer stack, the epitaxial layer stack being separated into a plurality of sub-stacks by the plurality of trenches so that the one or more first nano layers are separated into a plurality of first nano-channels, the one or more second nano layers are separated into a plurality of second nano-channels, and each of the plurality of sub-stacks includes one or more first nano-channels and one or more second nano-channels;
    recessing the plurality of intermediate layers so that the one or more first nano-channels and the one or more second nano-channels in each of the plurality of sub-stacks protrude from sidewalls of the plurality of intermediate layers;
    forming a plurality of top source/drain (S/D) regions in the plurality of trenches, the plurality of top S/D regions being made of a first material and in direct contact with the plurality of first nano-channels; and
    forming a plurality of bottom source/drain (S/D) regions in the plurality of trenches, the plurality of bottom S/D regions being made of a second material and in direct contact with the plurality of second nano-channels.

2. The method of claim 1, wherein forming the plurality of intermediate layers comprises:
    forming a bottom layer that are positioned on the substrate and made of SiGe, the SiGe having a Ge content between 80% and 100%; and
    forming a plurality of upper layers that are positioned over the bottom layer, and includes at least one or Ge, Si, SiGe, or GeSn.

3. The method of claim 1, wherein the one or more first nano layers comprises at least one of silicon or germanium.

4. The method of claim 1, wherein the compound material comprises Germanium-Tin (GeSn) so that the predetermined material ratio comprises a Sn content between 1% and 10% in the GeSn.

5. The method of claim 1, wherein forming the plurality of top S/D regions comprising depositing the first material doped with phosphorous in the plurality of trenches, the first material being in direct contact with the plurality of first nano-channels, and including silicon.

6. The method of claim 1, wherein forming the plurality of bottom S/D regions comprising depositing the second material doped with boron in the plurality of trenches, the second material being in direct contact with the plurality of second nano-channels, and including at least one of GeSi, Ge, GePt, GeSiSn, GePtSi, GePt, SiGePt, SiGeSn, or SiGeSnPt.

7. The method of claim 1, further comprising:
    removing the intermediate layers that are positioned in each of the plurality of sub-stacks; and
    forming a plurality of gate structures in each of the plurality of sub-stacks so that each of the one or more first nano-channels and each of the one or more second nano-channels being surrounded by a gate structure in a respective sub-stack.

8. A semiconductor device, comprising:
    a plurality of transistor pairs formed over a substrate, arranged side by side, and coupled to one another, each of the plurality of transistor pairs including a n-type transistor and a p-type transistor that are stacked over one another, wherein
    the n-type transistor has a first channel region that includes one or more first nano-channels made of a first compound material having a first bandgap value based on a first predetermined material ratio in the first compound material, the one or more first nano-channels extending laterally along the substrate, being stacked over the substrate and spaced apart from one another;

the p-type transistor has a second channel region that includes one or more second nano-channels made of a second compound material having a second bandgap value based on a second predetermined material ratio in the second compound material, the one or more second nano-channels extending laterally along the substrate, being stacked over the substrate and spaced apart from one another;

each of the one or more first nano-channels in the first channel region of the n-type transistor and each of the one or more second nano-channels in the second channel region of the p-type transistor are surrounded by a gate structure respectively;

the n-type transistor includes a first source/drain (S/D) region and a second S/D region, the first S/D region and the second S/D region of the n-type transistor being positioned at two ends of the one or more first nano-channels and in direct contact with the one or more first nano-channels, at least one of the first S/D region and the second S/D region of the n-type transistor being coupled to a first channel region of an adjacent n-type transistor; and the p-type transistor further comprises a first source/drain (S/D) region and a second S/D region, the first S/D region and the second S/D region of the p-type transistor being positioned at two ends of the one or more second nano-channels and in direct contact with the one or more second nano-channels, at least one of the first S/D region and the second S/D region of the p-type transistor being coupled to a second channel region of an adjacent p-type transistor.

9. The device of claim 8, wherein the first compound material comprises first Germanium-Tin (GeSn) so that the first predetermined material ratio comprises a Sn content between 1% and 6% in the first GeSn.

10. The device of claim 8, wherein the second compound material comprises second Germanium-Tin (GeSn) so that the second predetermined material ratio comprises a Sn content between 1% and 10% in the second GeSn.

11. The device of claim 8, wherein the first S/D region and the second S/D region of the n-type transistor comprises silicon doped with phosphorous, and the first S/D region and the second S/D region of the p-type transistor comprises at least one of GeSi, Ge, GePt, GeSiSn, GePtSi, GePt, SiGePt, SiGeSn, or SiGeSnPt.

* * * * *